United States Patent
Holzapfel

(10) Patent No.: US 10,586,477 B2
(45) Date of Patent: Mar. 10, 2020

(54) SYSTEM AND ASSOCIATED METHODS FOR ADVERTISING FROM A TRAFFIC SIGNAL CONTROL CABINET

(71) Applicant: On Street Media USA, LLC, Winter Park, FL (US)

(72) Inventor: Joseph Holzapfel, Ralston, NE (US)

(73) Assignee: On Street Media, USA, LLC, Winter Park, FL (US)

( * ) Notice: Subject to any disclaimer, the term of this patent is extended or adjusted under 35 U.S.C. 154(b) by 118 days.

(21) Appl. No.: 15/595,478

(22) Filed: May 15, 2017

(65) Prior Publication Data
US 2017/0352301 A1  Dec. 7, 2017

Related U.S. Application Data

(63) Continuation-in-part of application No. 14/974,543, filed on Dec. 18, 2015, now Pat. No. 9,918,549.

(60) Provisional application No. 62/093,456, filed on Dec. 18, 2014.

(51) Int. Cl.
| | |
|---|---|
| *G09F 23/00* | (2006.01) |
| *A47B 81/00* | (2006.01) |
| *E05C 19/00* | (2006.01) |
| *E05B 65/00* | (2006.01) |
| *H05K 5/00* | (2006.01) |
| *H05K 5/02* | (2006.01) |
| *H05K 7/18* | (2006.01) |

(Continued)

(52) U.S. Cl.
CPC .............. *G09F 23/00* (2013.01); *A47B 81/00* (2013.01); *E05B 65/00* (2013.01); *E05C 19/003* (2013.01); *F21V 33/0012* (2013.01); *G09F 13/0413* (2013.01); *H05K 5/0017* (2013.01); *H05K 5/0221* (2013.01); *H05K 7/183* (2013.01)

(58) Field of Classification Search
CPC ..... G09F 23/00; G09F 13/0413; A47B 81/00; E05B 65/00; E05B 65/006; E05C 19/003; H05K 5/0017; H05K 5/0221
See application file for complete search history.

(56) References Cited

U.S. PATENT DOCUMENTS

| | | | |
|---|---|---|---|
| 3,521,937 A | 7/1970 | Buhrmaster et al. | |
| 3,793,756 A * | 2/1974 | Kay | B65F 1/1426 220/908 |

(Continued)

*Primary Examiner* — Gary C Hoge
(74) *Attorney, Agent, or Firm* — Stephen G. Anderson; GrayRobinson, P.A.

(57) ABSTRACT

An advertising medium includes a frame enclosing a traffic signal control cabinet. The frame includes opposing rails for each side of the cabinet with opposing inside surfaces of the rails including grooves extending longitudinally along the rail and spaced from each other. A light panel is carried within one groove near, yet spaced from, surfaces of cabinet walls. An advertising panel is carried within a second groove. The advertising panel is spaced from the light panel and on an opposite side from the cabinet wall. A clear protective panel is carried within a third groove and opposite an outer surface of the advertising panel. Tie rods extend between lock devices which are secured to the rails such that removing the frame from its position around the cabinet is prevented. As a result, advertising material may be secured to a traffic signal control cabinet without intruding upon or modifying the cabinet.

15 Claims, 19 Drawing Sheets

(51) Int. Cl.
*F21V 33/00* (2006.01)
*G09F 13/04* (2006.01)

(56) References Cited

U.S. PATENT DOCUMENTS

| | | | | |
|---|---|---|---|---|
| 3,803,738 A | * | 4/1974 | Weiss | B65F 1/1426 |
| | | | | 220/210 |
| 3,866,824 A | | 2/1975 | Lewis | |
| 4,300,299 A | * | 11/1981 | Batky | G09F 7/18 |
| | | | | 40/607.03 |
| 4,639,725 A | | 1/1987 | Franke | |
| 5,496,081 A | * | 3/1996 | Rice | E05B 13/002 |
| | | | | 292/259 R |
| 5,605,364 A | * | 2/1997 | Shelledy | E05C 19/003 |
| | | | | 292/259 R |
| 5,622,397 A | * | 4/1997 | Rice | E05B 13/002 |
| | | | | 292/259 R |
| 5,729,924 A | | 3/1998 | Reading | |
| 5,826,923 A | * | 10/1998 | Bethurem | E05C 19/003 |
| | | | | 292/259 R |
| 6,092,319 A | | 7/2000 | Hicks | |
| 7,096,625 B1 | | 8/2006 | Hering | |
| 7,661,733 B1 | * | 2/2010 | Angel | E05C 19/003 |
| | | | | 292/259 R |
| 2001/0035701 A1 | * | 11/2001 | Holzheid | G09F 15/0012 |
| | | | | 312/204 |
| 2007/0158957 A1 | * | 7/2007 | Kramer | E05C 19/003 |
| | | | | 292/259 R |
| 2007/0205703 A1 | * | 9/2007 | McLuckie | A62C 3/06 |
| | | | | 312/216 |
| 2011/0203335 A1 | * | 8/2011 | DeWalch | E05B 65/0089 |
| | | | | 70/158 |
| 2014/0080406 A1 | | 3/2014 | Freitas et al. | |
| 2014/0361551 A1 | * | 12/2014 | Rickman | E05B 65/0089 |
| | | | | 292/155 |
| 2015/0047240 A1 | | 2/2015 | Pyc et al. | |
| 2015/0191949 A1 | * | 7/2015 | Wilson | E05C 19/003 |
| | | | | 292/259 R |
| 2015/0300628 A1 | * | 10/2015 | Dunn | F21V 33/0012 |
| | | | | 349/58 |
| 2016/0314724 A1 | | 10/2016 | Benasillo | |
| 2017/0190509 A1 | * | 7/2017 | Reeb | B65F 1/122 |
| 2017/0352301 A1 | * | 12/2017 | Holzapfel | G09F 23/00 |

* cited by examiner

SYSTEM AND ASSOCIATED METHODS FOR ADVERTISING FROM A TRAFFIC SIGNAL CONTROL CABINET

CROSS REFERENCE TO RELATED APPLICATIONS

This application is a continuation-in-part of, and claims priority to, U.S. patent application Ser. No. 14/974,543 entitled "System and Associated Methods for Advertising from a Traffic Signal Control Cabinet" filed Dec. 18, 2015, which itself claims priority to U.S. Provisional Application Ser. No. 62/093,456, filed Dec. 18, 2014, the contents of which are incorporated by reference and commonly owned.

FIELD OF THE INVENTION

The present invention generally relates to advertising display devices and in particular to an advertising system mountable on a cabinet structure without jeopardizing integrity of the cabinet structure with a robust locking mechanism.

BACKGROUND

Advertising media take on a variety of forms as do the devices designed to secure the advertising media to a structural support while allowing clear public view. Examples of such devices are included in U.S. Pat. No. 7,096,625 to Hering for "A Method of Displaying Advertising on a Turnstile" and U.S. Pat. No. 6,092,319 to Hicks for an "Apparatus for Connecting Advertising Substrate to Trucks." Yet further and as disclosed in U.S. Application Publication No. 2001/0035701 to Holzheid for "Framing for Public Space Housings to Hold and to Facilitate Display of Visual Materials," outdoor cabinets such as traffic control boxes provide potential sites for advertising and provide a source of advertising revenue.

As disclosed in Holzheid, equipment must be protected from the elements as well as vandalism or other destruction by humans. In many cases, the equipment is protected by a housing for traffic signal control boxes, which are especially susceptible to vandalism. Traffic signal control boxes are generally vertical structures positioned at street intersections for the purpose of housing the electronics needed to control traffic signals at the intersections. For example, while traffic control cabinets generally located at each intersection having traffic lights have blank space on side walls, municipalities frown on "bumper sticker" styled signs stuck to the side walls and such signs are difficult to remove. Accordingly, there is a need in the art for providing an advertising option for advertising from such traffic control cabinets without the need for intrusion into the cabinet walls surfaces and with ease in replacing advertising indicia. Yet further, while outer coverings for such housings may be known, there remains a need to attach such covers and thus possible advertising media to the housings without intruding or modifying the housing. The embodiments disclosed herein are aimed at overcoming these and other needs in the art.

SUMMARY

Embodiments of the present invention are herein described by way of example and directed to advertising display methods and devices mountable on a cabinet structure without jeopardizing the integrity of the cabinet.

By way of example in satisfying a need, embodiments of the invention permit signage, such as advertising, to be placed on a traffic signal control cabinet, or the like, without scratching, marring, or discoloring the original surface of the cabinet, and further without being invasive in any way to the cabinet or its function. Further, the signage may be carried by the cabinet without interfering with the cabinet access door. Embodiments of the invention permit a frictional attachment of the signage while withstanding relatively high winds and severe weather without damage to the signage. Signage may be attached to any or all sides of the cabinet while having the attaching means inaccessible to the general public.

One embodiment provides an advertising medium which may comprise a frame enclosing a traffic signal control cabinet. The frame may include opposing rails for each side of the cabinet with opposing inside surfaces of the rails including grooves extending longitudinally along the rail and spaced from each other. A light panel may be carried within one groove near, yet spaced from, surfaces of cabinet walls. An advertising panel may be carried within a second groove. The advertising panel is spaced from the light panel and on an opposite side from the cabinet wall. A clear protective panel may be carried within a third groove and opposite an outer surface of the advertising panel. Tie rods may extend between lock devices which are secured to the rails such that removing the frame from its position around the cabinet is prevented. Each lock device is generally comprised of a plurality of bores and bolts and secured using a key. As a result, advertising material may be secured to the traffic signal control cabinet without intruding or modifying the cabinet.

BRIEF DESCRIPTION OF DRAWINGS

For a fuller understanding of the invention, reference is made to the following detailed description, taken in connection with the accompanying drawings in which.

DETAILED DESCRIPTION OF EMBODIMENTS

The teachings of the present invention will now be described more fully hereinafter with reference to the accompanying drawings, in which embodiments of the invention are shown by way of illustration and non-limiting example. This invention may be embodied in many forms and should not be construed as limited to the embodiments set forth herein. Rather, these embodiments are provided so that this disclosure will be thorough and complete, and will fully convey the scope of the invention to those skilled in the art.

Figure 1:
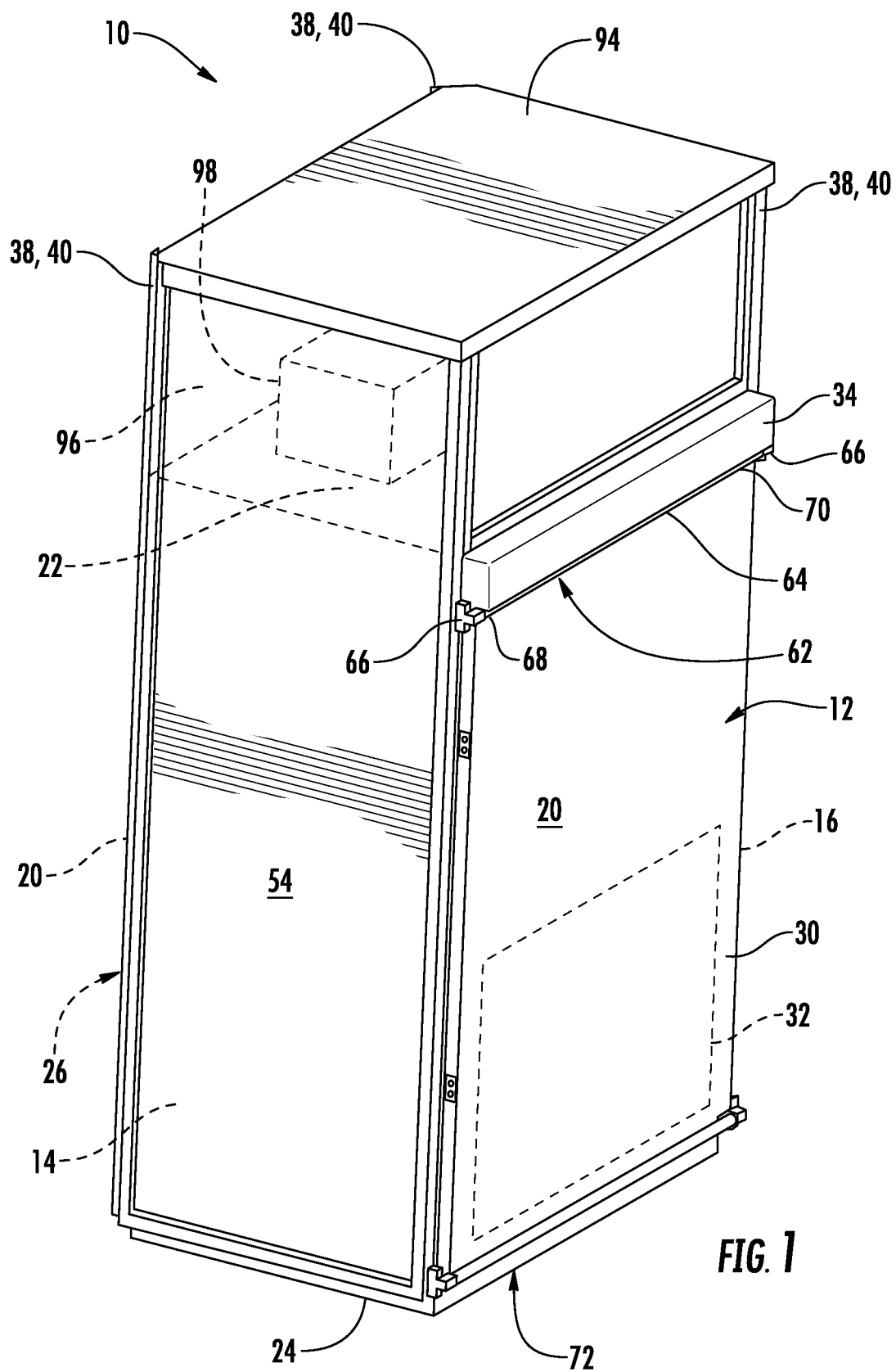
FIG. 1 is a perspective view of one embodiment of the present invention including an advertising medium secured to a traffic signal control cabinet.

With reference initially to FIG. 1, one embodiment of the invention is herein described as an advertising medium 10 employing a traffic signal control cabinet 12. As generally described, the cabinet 12 comprises a first planar side wall 14 spaced from a second planar side wall 16, with a planar front wall 18 and rear wall 20 extending therebetween. Top and bottom walls 22, 24 add to a rectangular shaped housing 26 having an enclosed storage area 28 formed therein. The cabinet 12 further comprises a door 30 extending over an opening 32 formed in the rear wall 20, by way of non-limiting example, and wherein the top wall 22 extends beyond at least the rear wall 20 to form a flange 34 above the door 30.

As illustrated with reference to FIG. 2, a frame 36 generally encloses the cabinet 12. The frame 36 has opposing rails 38, 40 for each of the side 14, 16, rear 20 and front 18 walls of the cabinet 12. Opposing inside surfaces 42, 44 of the rails 38, 40 include a plurality of grooves 46 extending longitudinally along the rail and spaced from each other, as illustrated with reference to FIG. 3.

Figure 3:
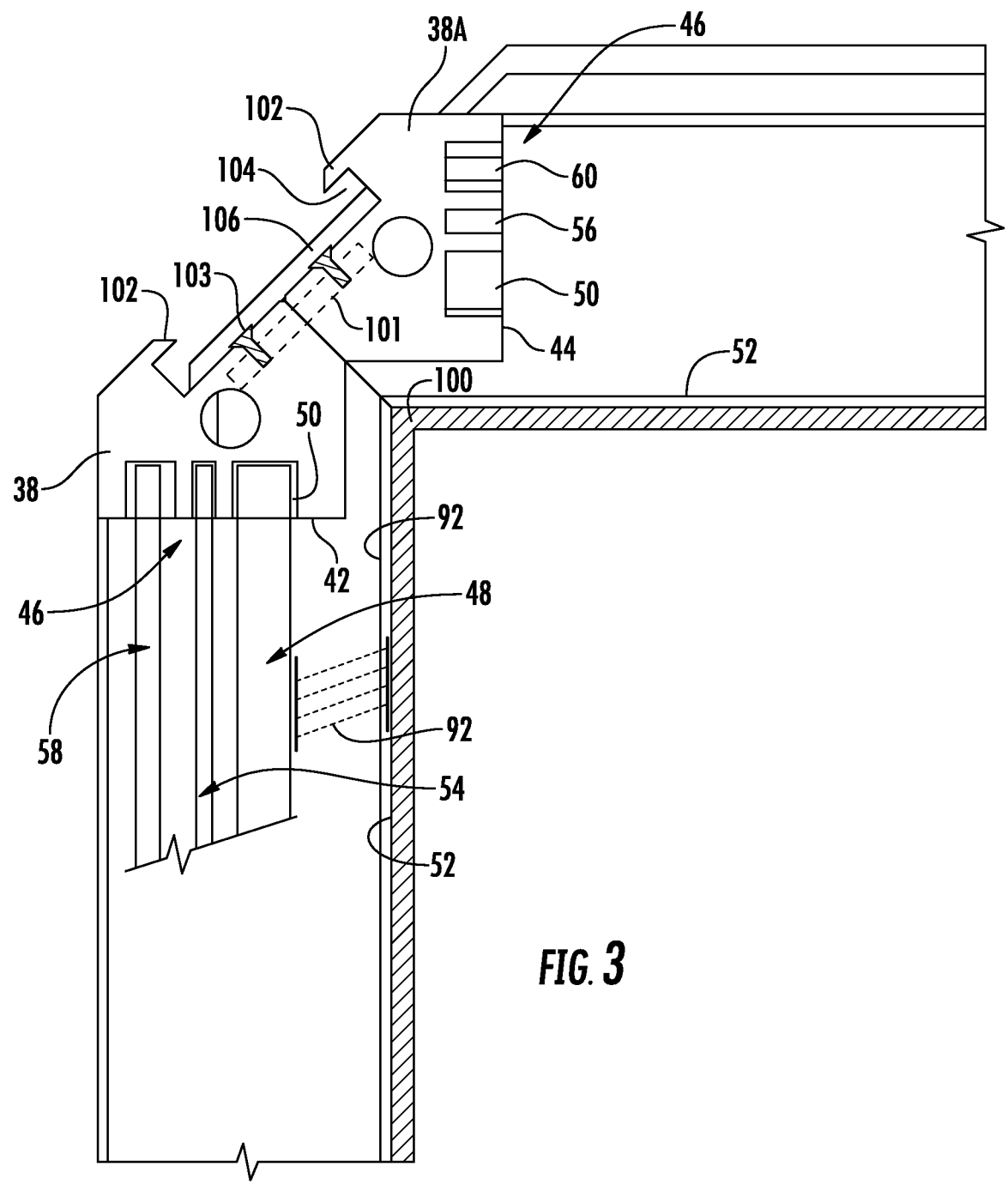
FIG. 3 is a partial cross sectional view illustrating rail portions of the frame of the embodiment of FIG. 1 and use thereof.

As further illustrated with reference to FIG. 3, a light panel 48 is carried within a first groove 50 and spaced from surfaces 52 of the respective walls. An advertising panel 54 is carried within a second groove 56 and spaced from the light panel 48 at a further distance from the cabinet wall surface 52 than the light panel 48. A clear protective panel 58 is carried within a third groove 60 and itself spaced from the advertising panel 54 and further distanced from the cabinet wall surface 52 than the advertising panel 54.

Figure 4:
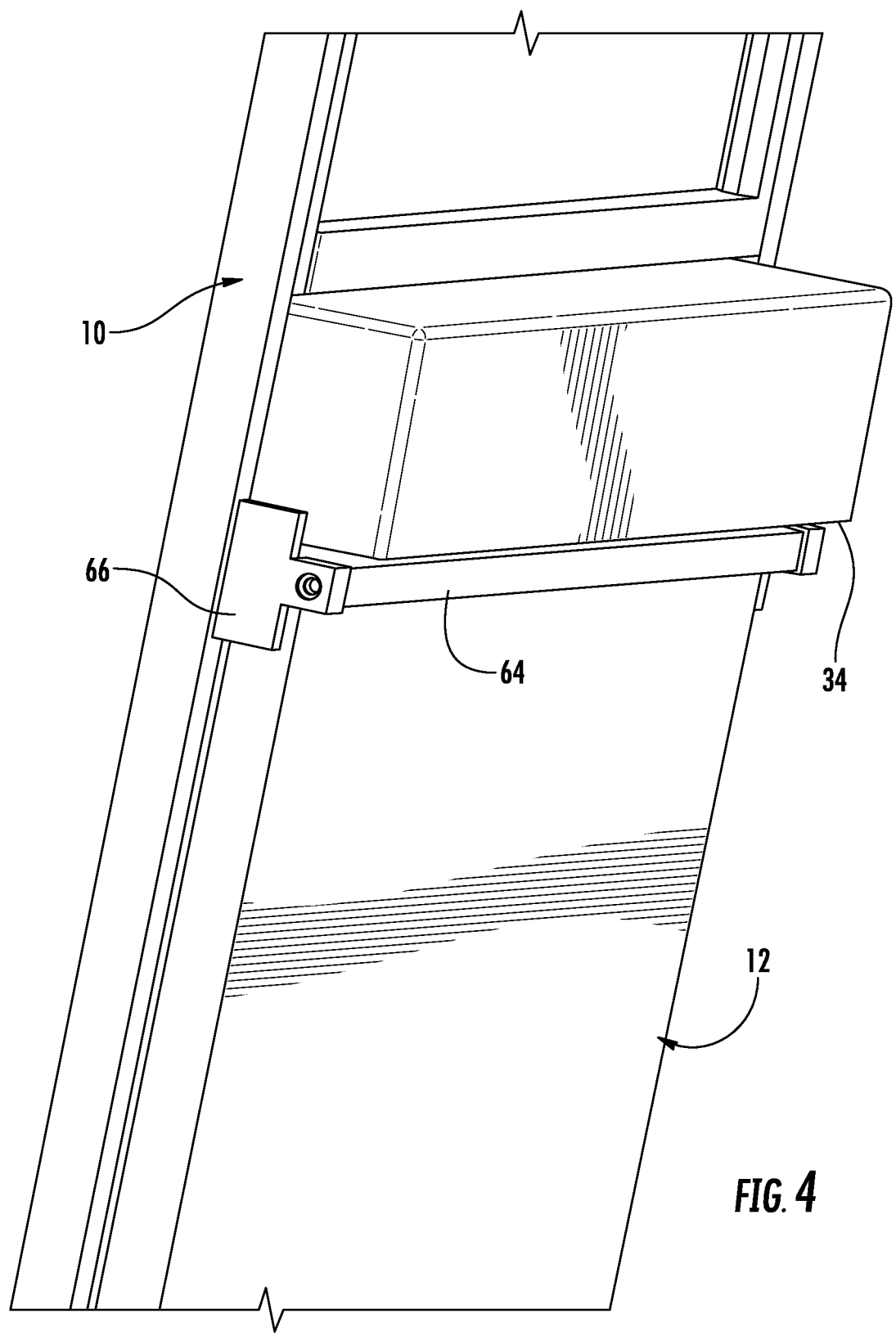
FIG. 4 is a partial perspective view of the embodiment of FIG. 1 illustrating a locking assembly portion according to the teachings of the present invention.
Figure 5:
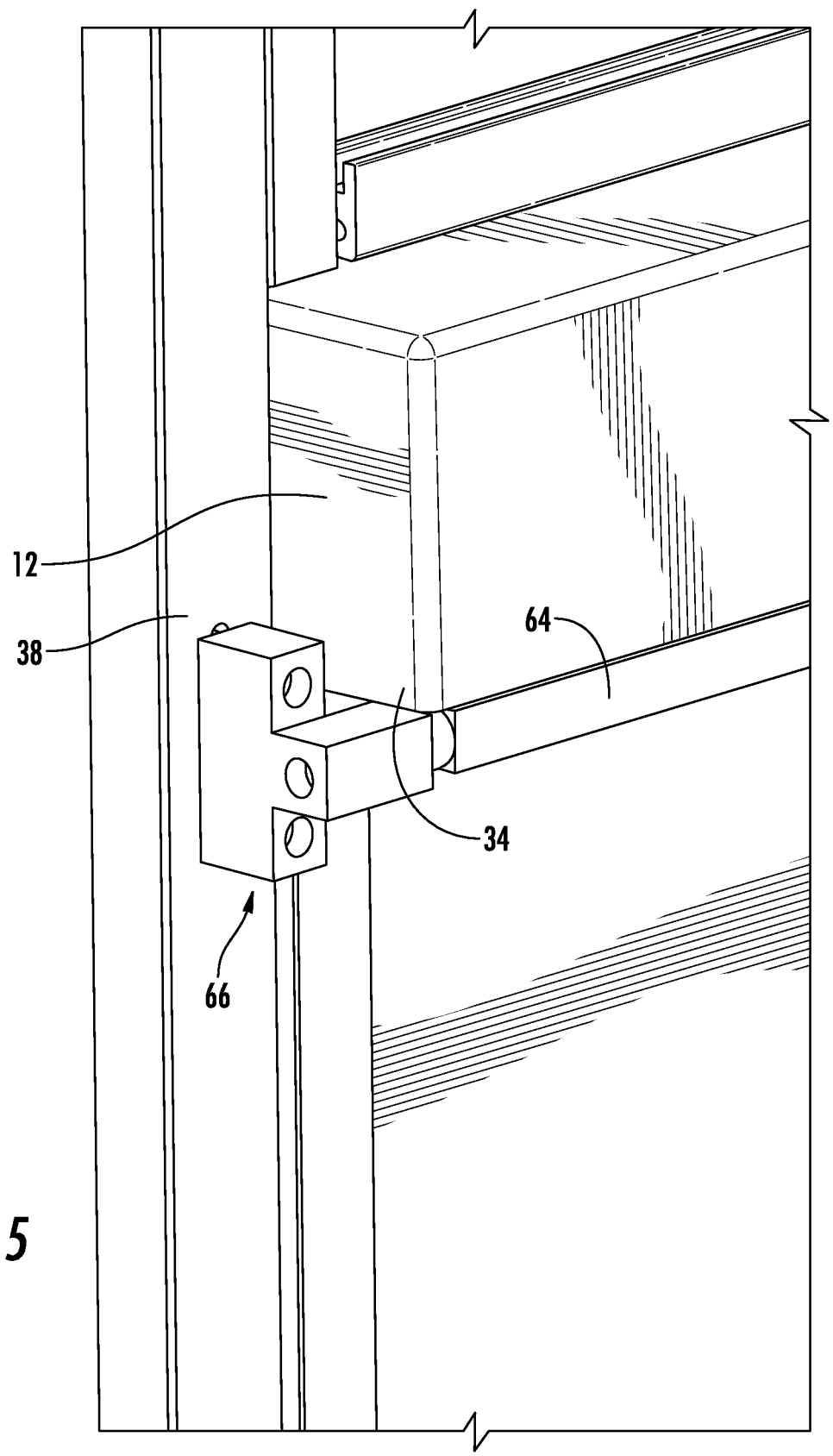
FIG. 5 is a closer perspective view of the embodiment illustrated in FIG. 4 further illustrating a lock device used therewith.

As illustrated with reference again to FIGS. 1 and 2, and now to FIGS. 4 and 5, a first locking assembly 62 includes a first tie rod 64 extending between opposing rails 38, 40 proximate the rear wall 20 and under the flange 34. A lock device 66 is affixed to free ends 68, 70 of the first tie rod 64.

The lock device 66 is secured to the opposing rails 38, 40 proximate the rear wall 20 and under the flange 34 such that a vertical lifting of the frame 36 is limited by interaction of the first tie rod 64 with the flange.

Figure 2:
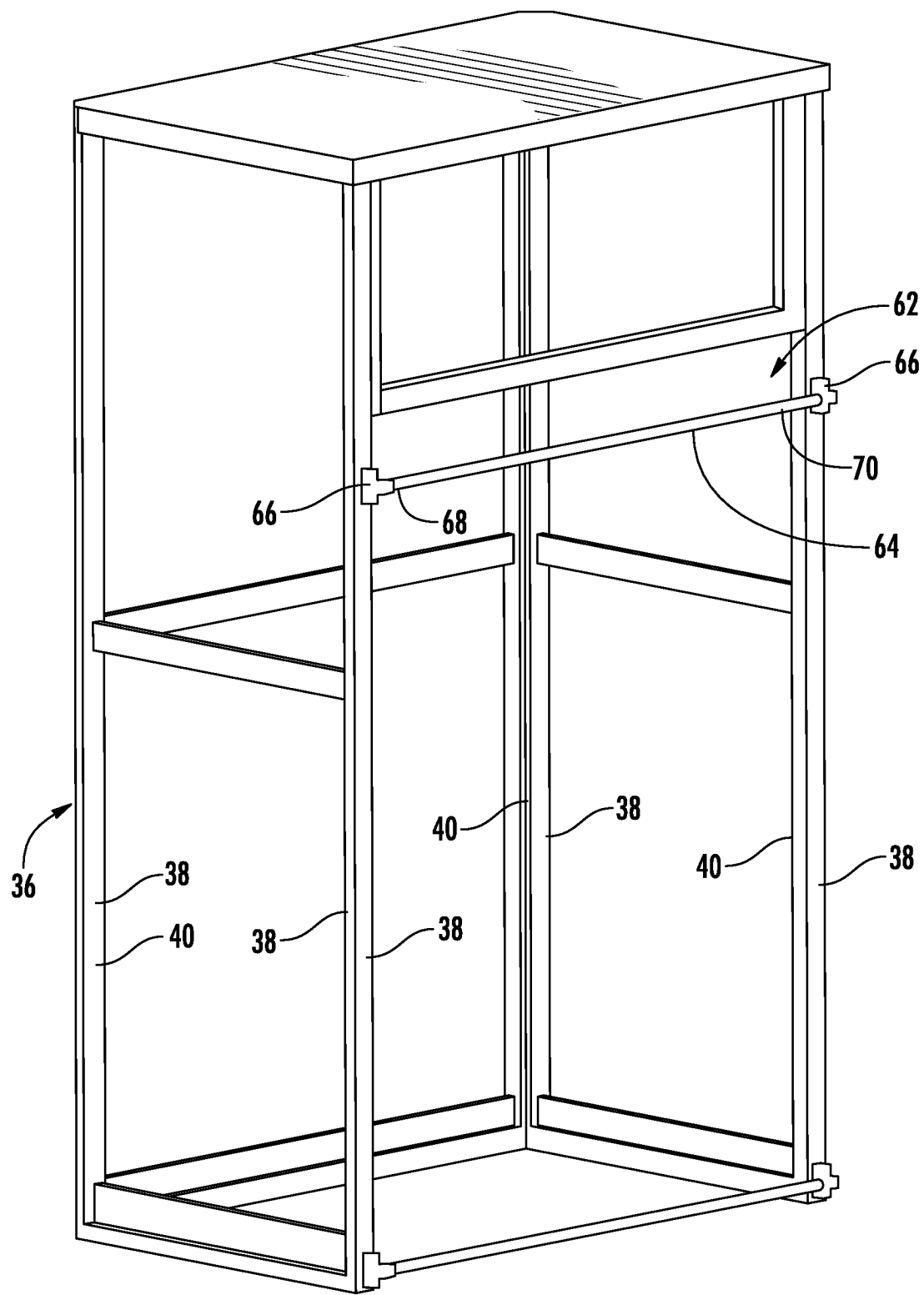
FIG. 2 is a perspective view of a frame assembly of the embodiment of FIG. 1 illustrating selected elements thereof, by way of non-limiting example.
Figure 6:
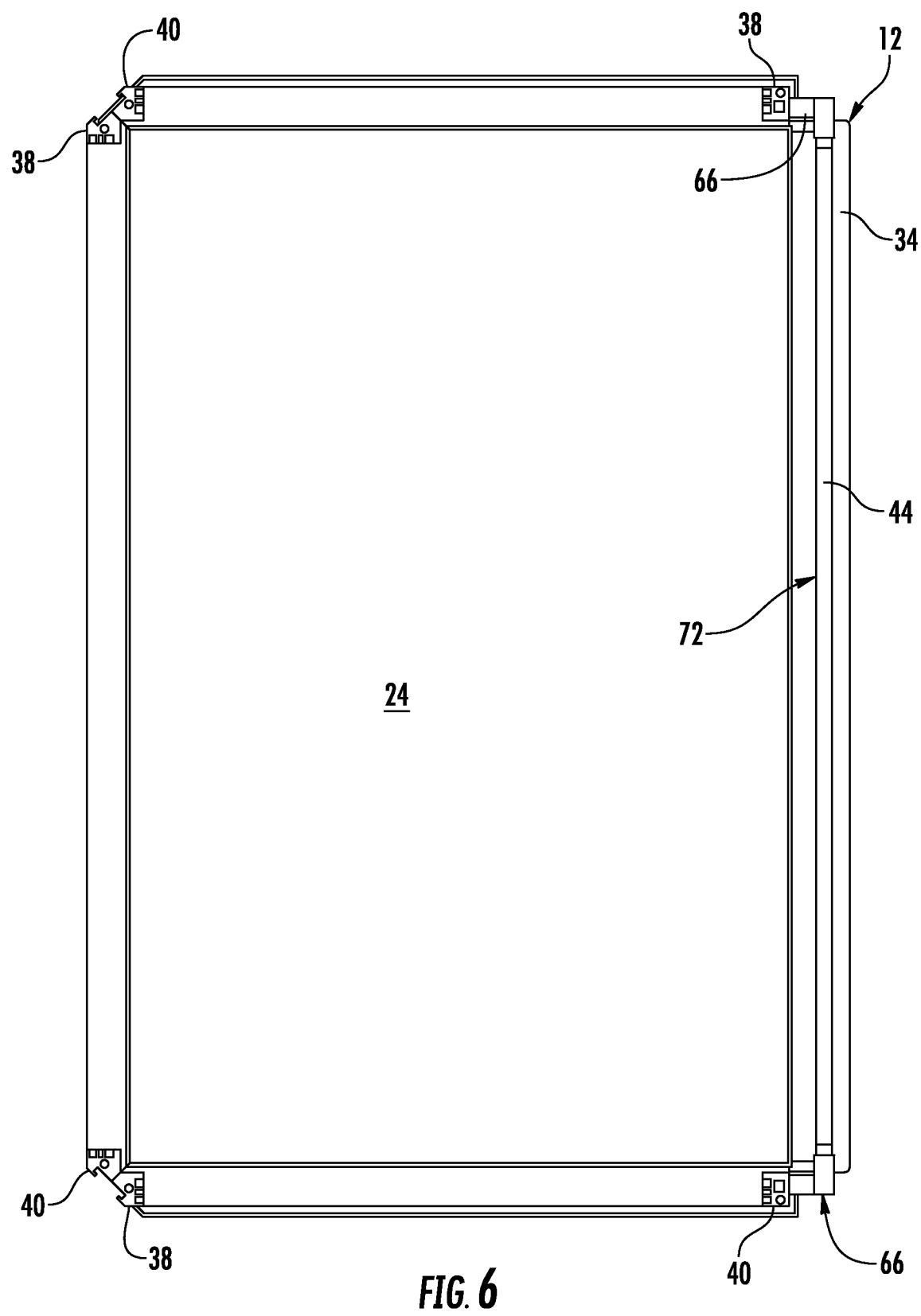
FIG. 6 is a bottom view of the embodiment of FIG. 1.

With continued reference to FIGS. 1 and 2 and to FIG. 6, a second locking assembly 72 includes a second tie rod 74 extending between the opposing rails 38, 40 proximate the rear wall 20 and at a lower portion 76 of the rear wall 20 sufficient for permitting access into the cabinet housing 26 through the opening 32 when the door 30 is in an opened position. The lock device 66, as above described, is affixed to each of opposing ends of the second tie rod 74 with the lock device secured to the opposing rails 38, 40 with the second tie rod 74 held proximate the rear wall 20.

As illustrated with reference to FIG. 7, one embodiment of the lock device 66, herein described by way of example, comprises a body 78 having a first leg 80 including a first bore 82 extending longitudinally therein. The first bore 82 receives the free end 68, 70 of the tie rods 64, 74, wherein a first bolt 84 extends into the first bore 82 to secure the tie rod to the body 78. A second leg 86 extends generally perpendicular to the first leg 80. The second leg 86 includes a second bore 88, herein two second bores illustrated by way of example, extending through the second leg. A second bolt 90 extends through the second bore 88 into the rail 38, 40 and secures the body 78 to the rail, thus securing the lock device 66 to the rails.

Figure 7:
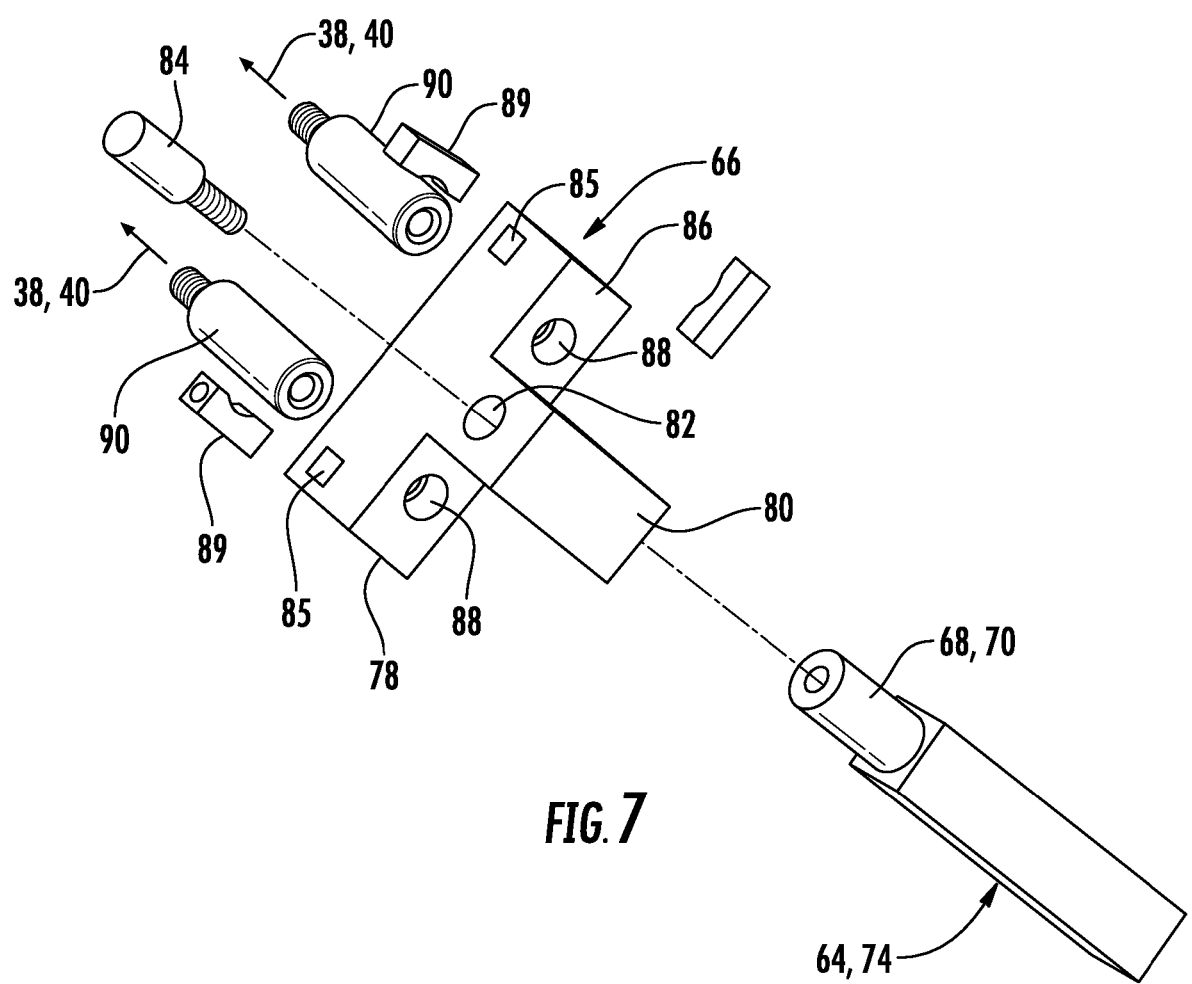
FIG. 7 is an exploded perspective view of the lock device of FIG. 5.

With continued reference to FIG. 7, the second leg 86 includes a third bore 85 extending therein proximate the second bore 80 and generally perpendicular to an axis thereof, the lock device 66 including a key 89 extending into the third bore 85 mating with the second bolt 90 for fixing the second bolt within the second bore and preventing movement thereof.

With reference again to FIG. 3, a foam pad or sheet 92 may be sandwiched between at least some of the side wall surfaces 52 of the cabinet housing 26 and respective light panels 48. The foam pads may optionally have a thickness for sufficiently preventing damage to the wall surfaces 52 and sufficiently thick to contact both the wall surface 52 and the light panel 48, as desired.

With reference again to FIGS. 1 and 2, a top cover panel 94 is secured to the plurality of rails 38, 40 thus contributing to the forming of the frame 36, wherein the rails, and thus the frame extends beyond the top wall 22 of the cabinet 12 for providing a utility storage area 96 between at least a portion of the top wall of the cabinet and the top cover panel. Electronic and other equipment, such as batteries, may be securely stored within the utility storage area 96.

With reference again to FIG. 3, adjacent rails 38, 38A of the frame 36 located at corners 100 of the cabinet 12 are secured together, using bands 101 and screws 103, by way of example. The mirror image shape of each rail 38, 38A is such that tabs 102 On each rail combine to form a slot 104 longitudinally extending along the adjacent rails 38, 38A, by way of example. A ribbon cover 106 extends in the slot and limits access to the screws 103, by way of further example.

Figure 8:
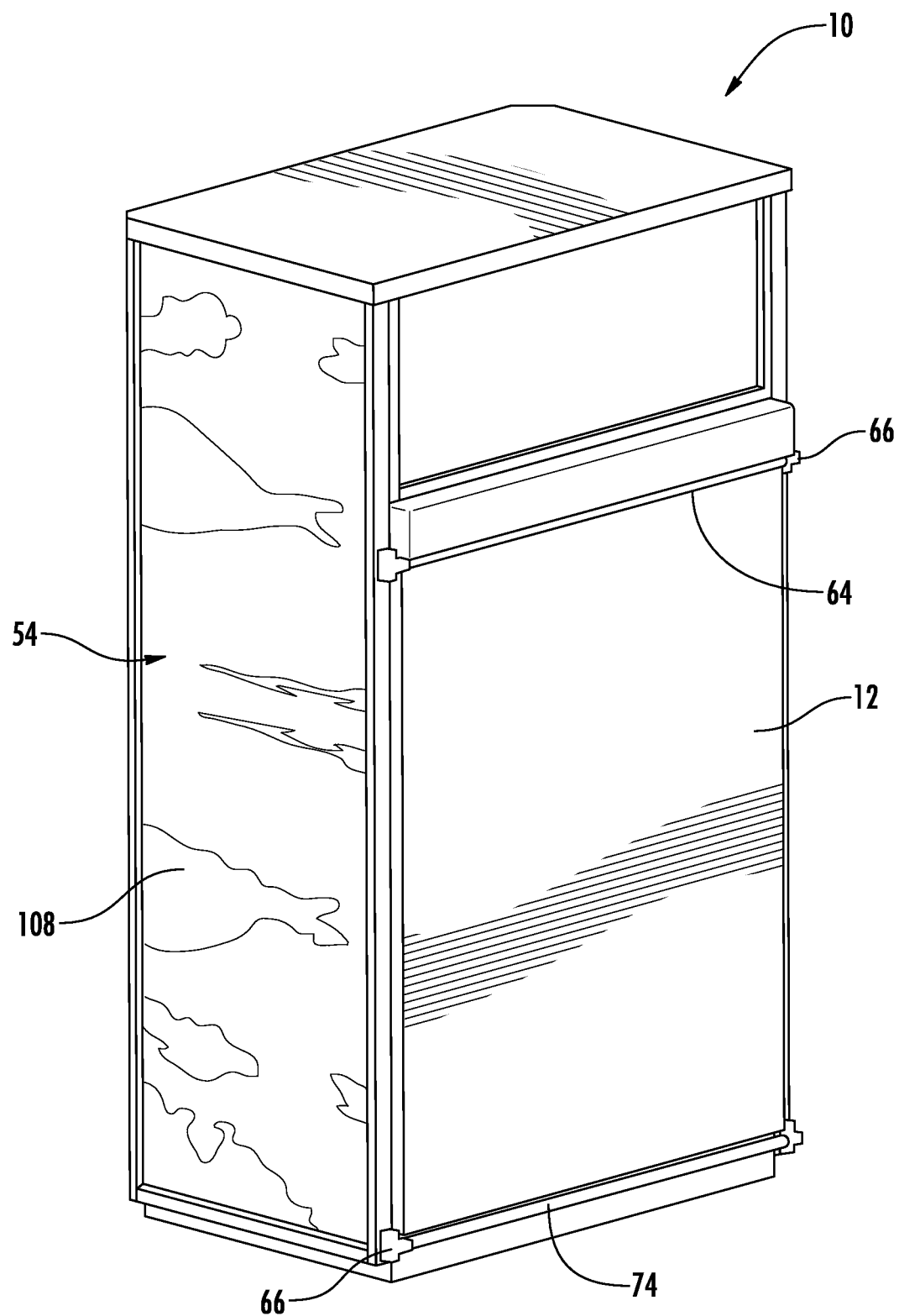
FIG. 8 is a front left perspective view of the embodiment of the present invention, herein described by way of example only, illustrating advertising medium displayed from the traffic signal control cabinet.
Figure 9:
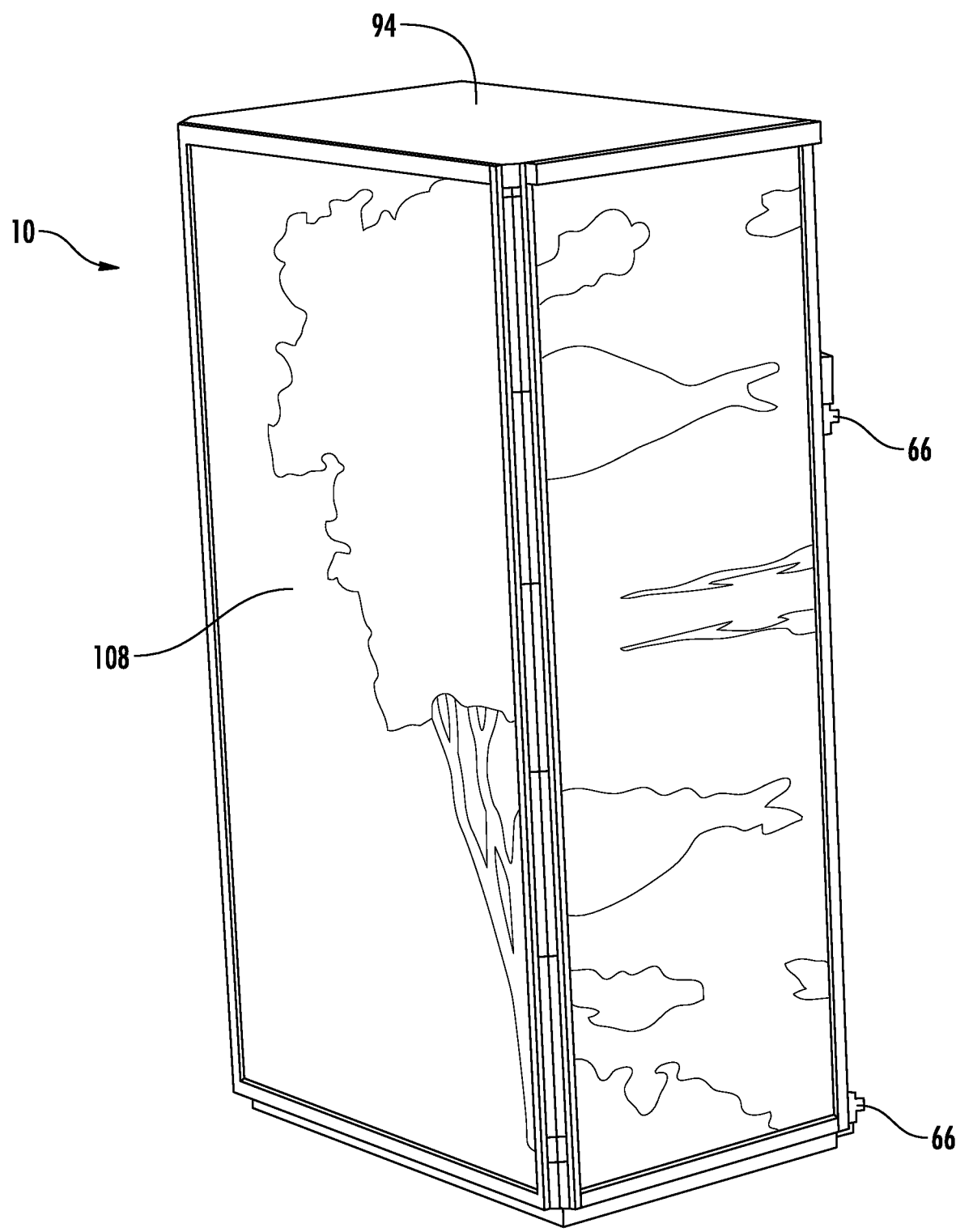
FIG. 9 is a rear right perspective view of the embodiment of FIG. 8.

As illustrated with reference to FIGS. 8 and 9, it will come to the mind of those skilled in the art that commercial and environmental promotions indicia/images 108 may be attractively displayed from what is typically a bland box. Such use can further benefit the government entities responsible for traffic signal control cabinets by providing desired revenue while maintaining the integrity of the traffic signal control.

Alternative Embodiment

With reference initially to FIGS. 10 through 14, one embodiment of the invention is herein described as an advertising medium 210 employing a traffic signal control cabinet 212. As generally described, the cabinet 212 comprises a first side wall 214 spaced from a second side wall 216, with a front wall 218 and rear wall 220 extending therebetween. Top and bottom walls 222, 224 complete a rectangular shaped housing having an enclosed storage area 228 therein. In one embodiment, at least one of the front wall 218 and the rear wall 220 is defined by and/or comprises a door for accessing the enclosed storage area 228. In one exemplary embodiment, the top wall 222 extends beyond at least one of the front wall 218 and the rear wall 220 to form a flange 234 above the door, which extends outward from the cabinet 212. A graphic 300 can be placed generally on or within an advertising panel 254, but may alternatively be placed anywhere on the advertising medium 210 and/or cabinet 212. In one embodiment, the advertising medium 210 comprises rails 238, 240, 242, 244 generally conforming to the shape of the underlying cabinet 212 and aligned with the peripheral corners thereof. The rails may be further secured to one another with a plurality of secondary rails 246. Furthermore, the rails may extend upward beyond the top wall of the cabinet and define a secondary enclosed structure that may used for additional advertising, storage, or other pertinent use.

Figure 15:
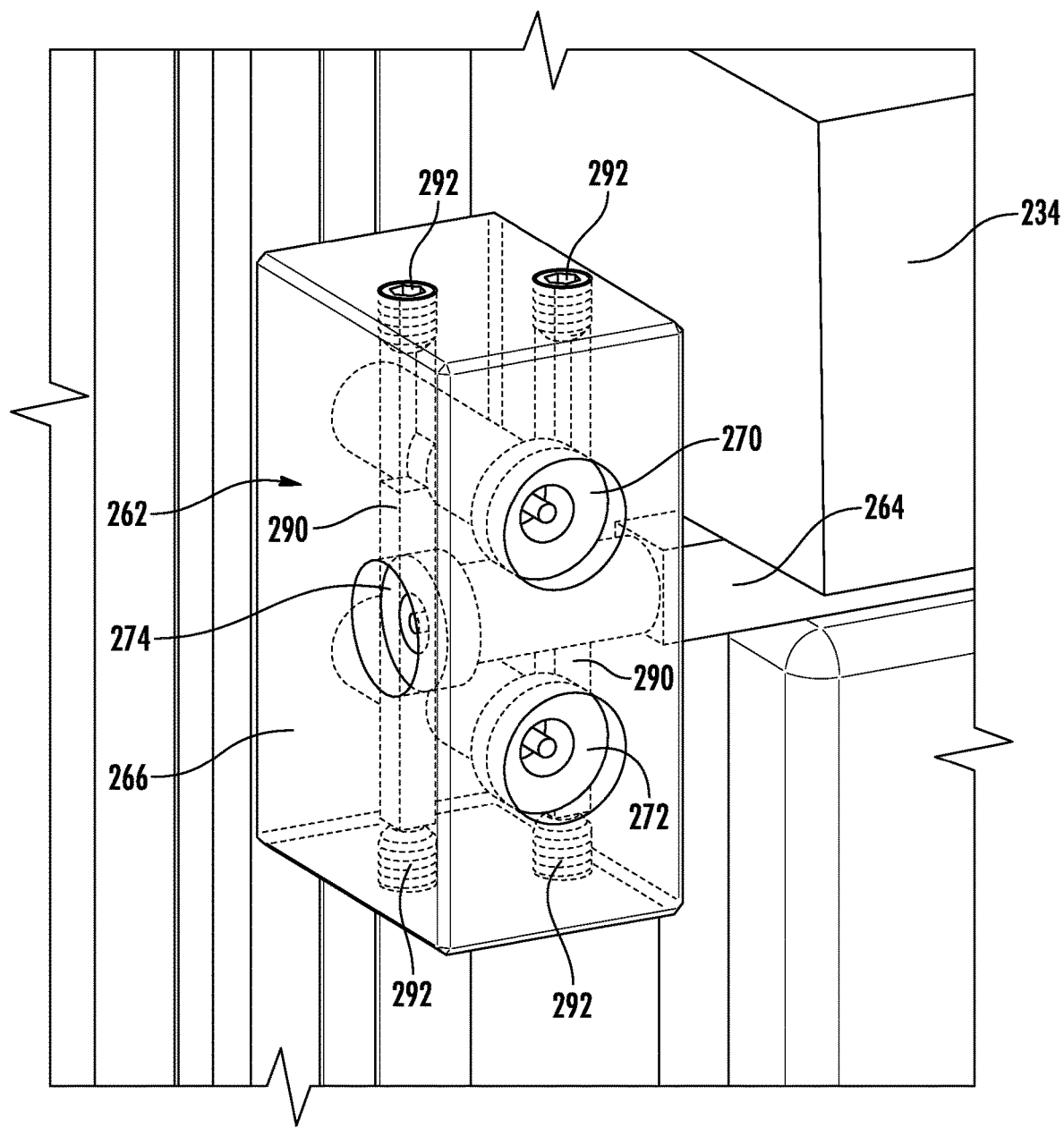
FIG. 15 is a front left perspective view of the locking mechanism of the present invention.
Figure 16:
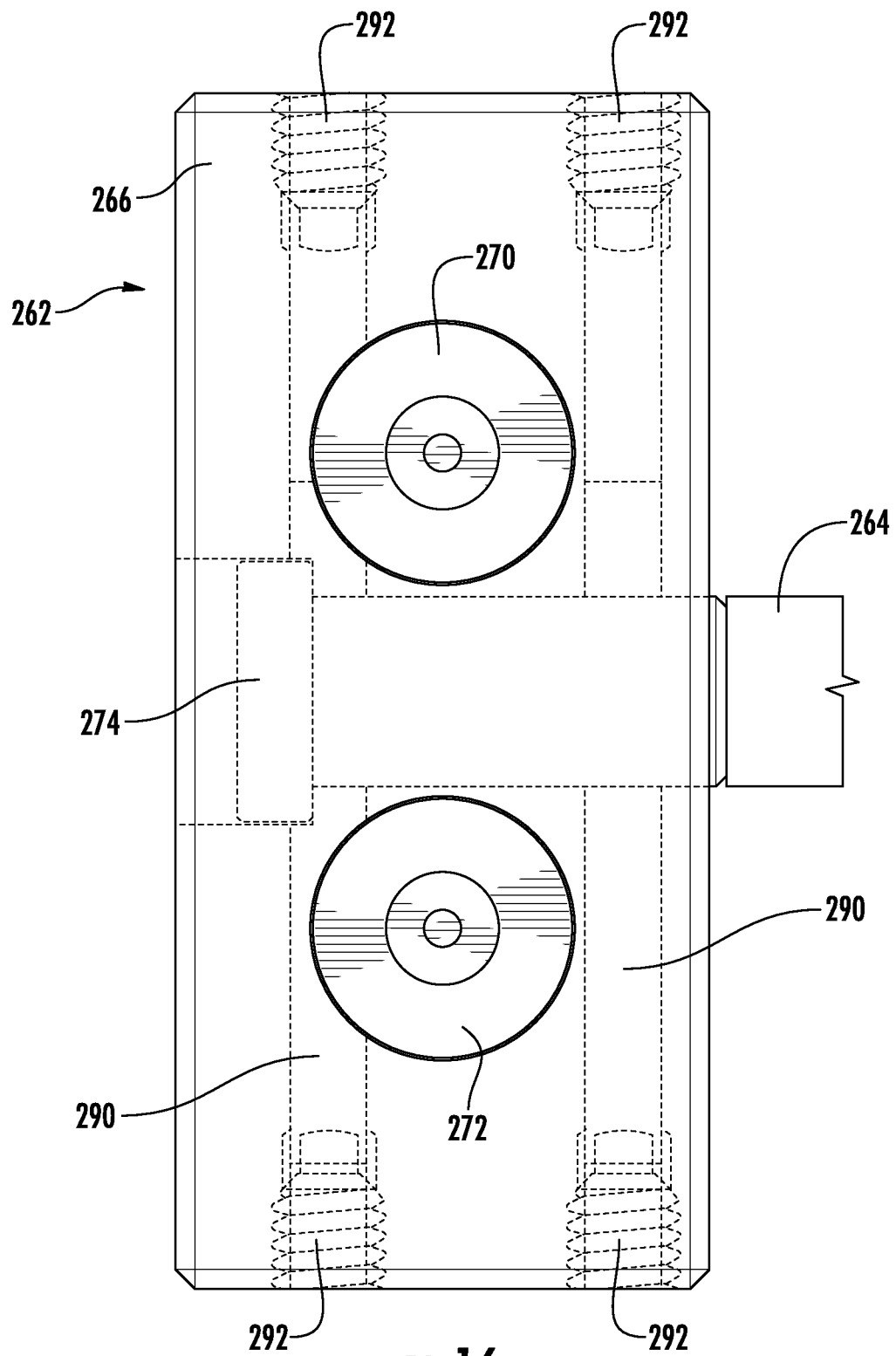
FIG. 16 is a side perspective view of the locking mechanism of FIG. 15.
Figure 17:
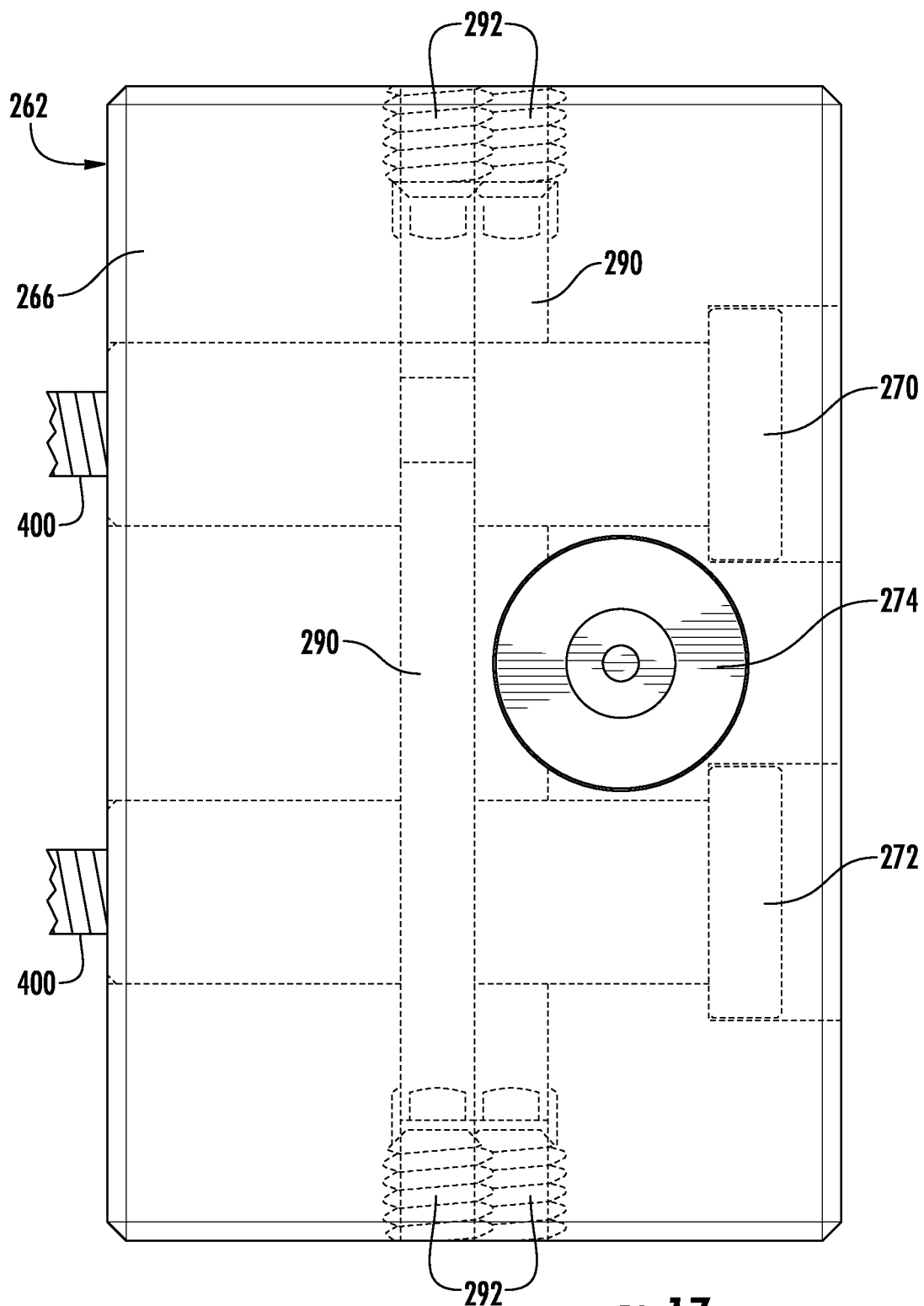
FIG. 17 is a front perspective view of the locking mechanism of FIG. 15.
Figure 18:
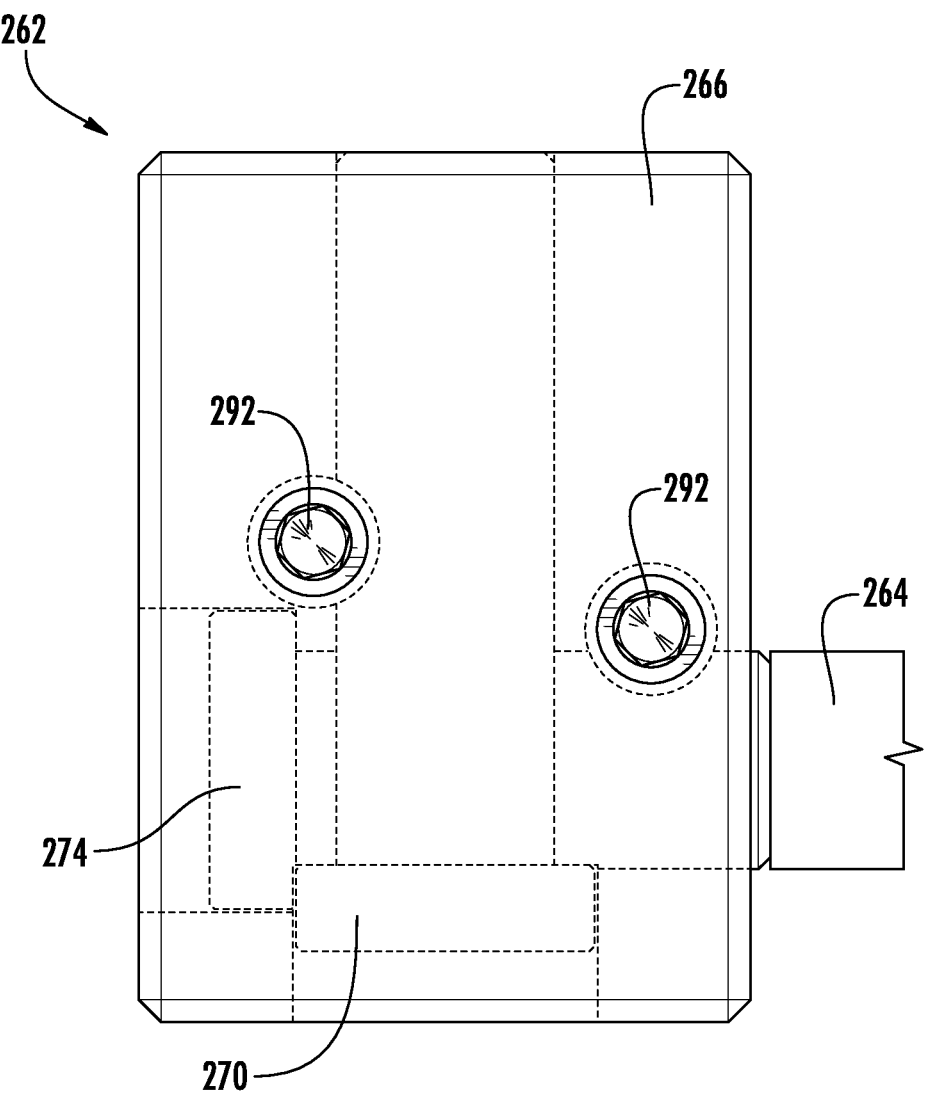
FIG. 18 is a top perspective view of the locking mechanism of FIG. 15.
Figure 19:
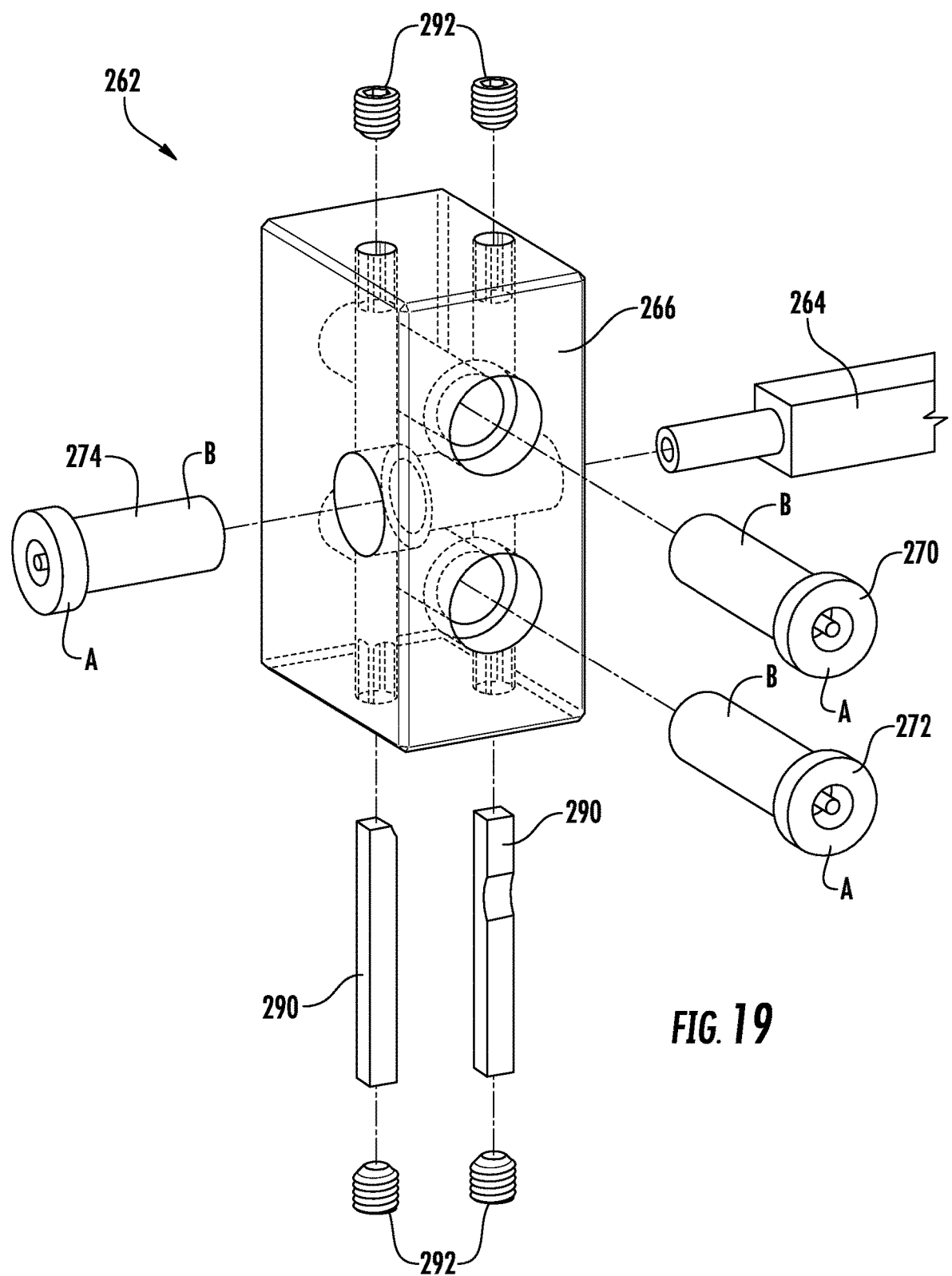
FIG. 19 is an exploded view of the locking mechanism of FIG. 15.

With continued reference to FIGS. 10-14, and now with reference to FIGS. 15-19, the cabinet 212 further comprises at least one locking assembly 262. The locking assembly 262 is configured and positioned for restricting access to the enclosed storage area of the cabinet 212. The locking assembly may also secure any advertising panels configured as herein described with reference to the above-described embodiments to prevent defacing thereof. As depicted in FIG. 15, an embodiment of the locking assembly comprises at least one lock device having a housing 266 configured for receiving first 270, second 272, and third 274 locking pins, each locking pin having opposing first (a) and second (b) ends, the first end configured for receiving a key and the second end configured for receiving a connector. The first locking pin 270 may be oriented substantially parallel to the second locking pin 272, and the third locking pin 274 may be oriented substantially perpendicular to the first 270 and second 272 locking pins.

Figure 10:
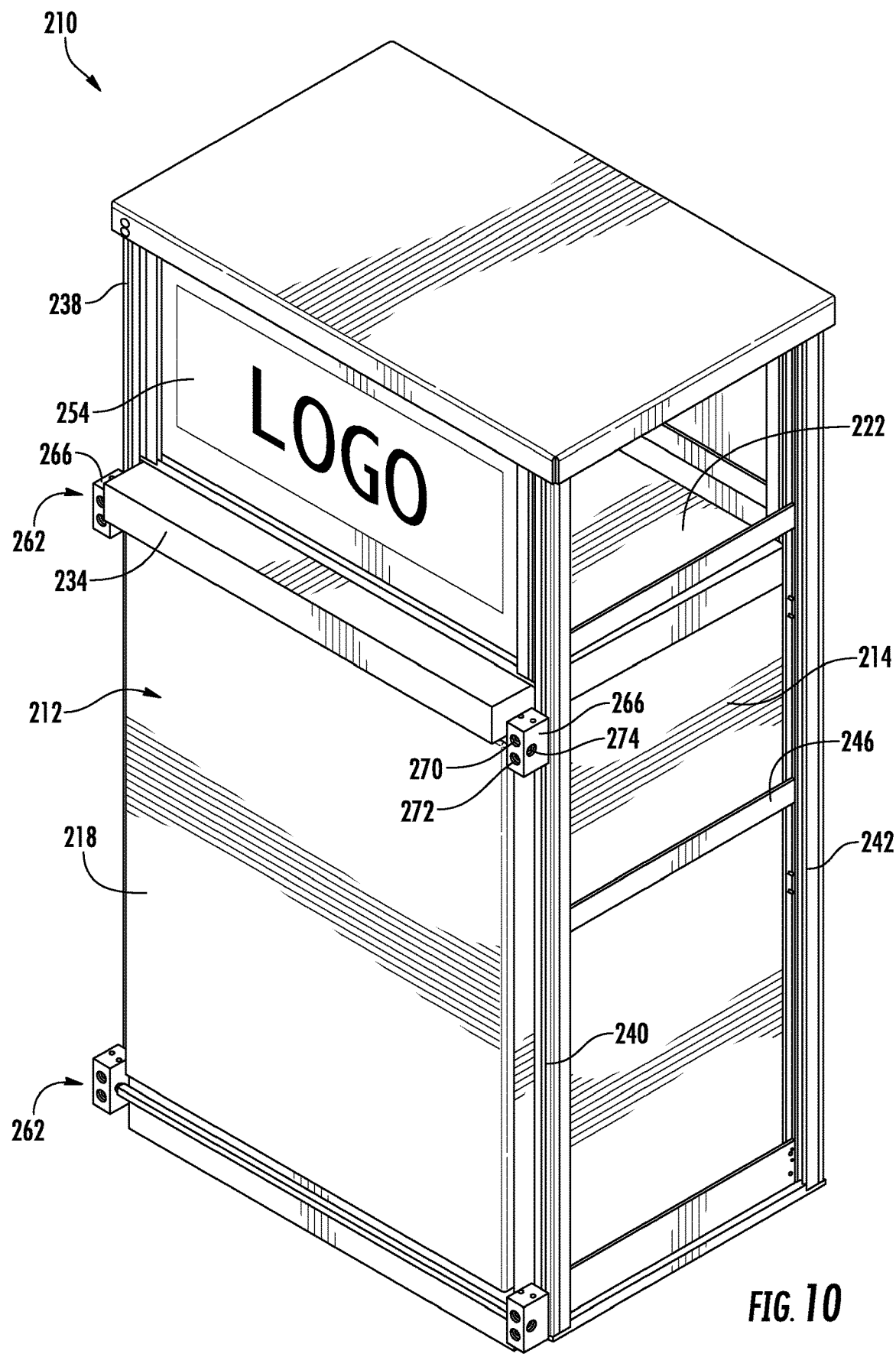
FIG. 10 is a perspective view of one embodiment of the present invention including an advertising medium secured to a traffic signal control cabinet.
Figure 11:
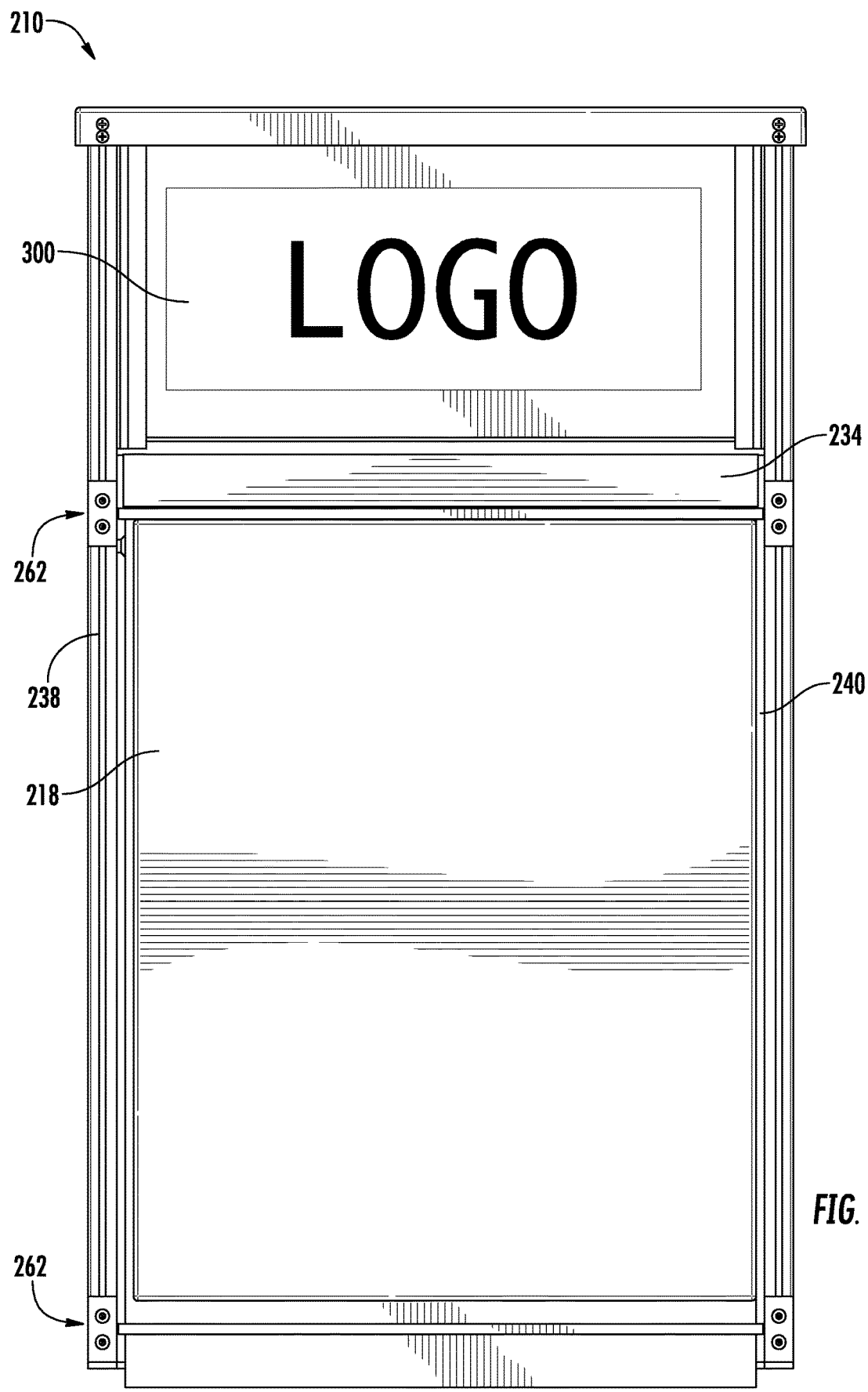
FIG. 11 is a perspective view of a frame assembly of the embodiment of FIG. 1 illustrating selected elements thereof, by way of non-limiting example.
Figure 12:
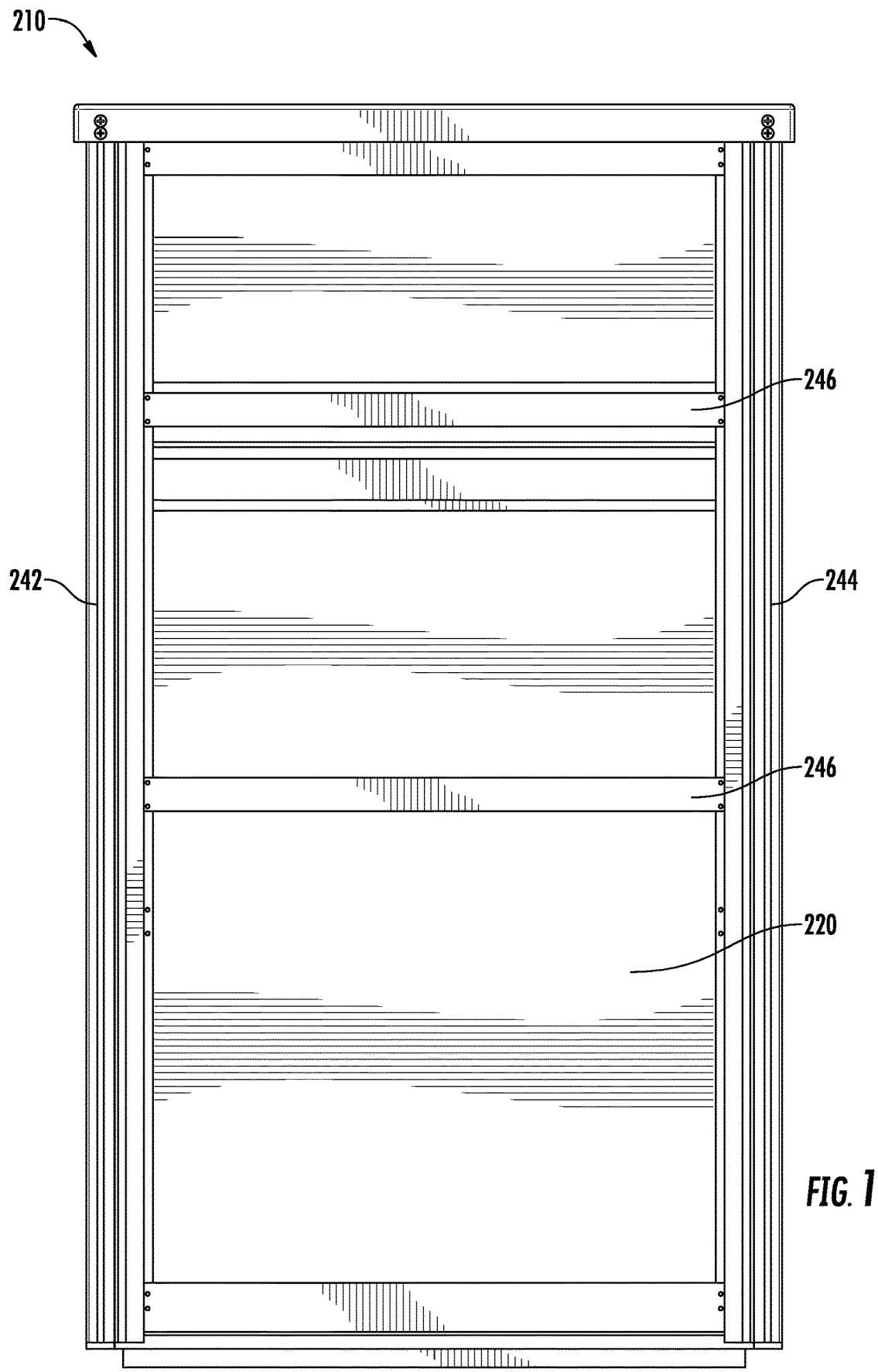
FIG. 12 is a rear perspective view of the frame of the embodiment of FIG. 1 and use thereof.
Figure 13:
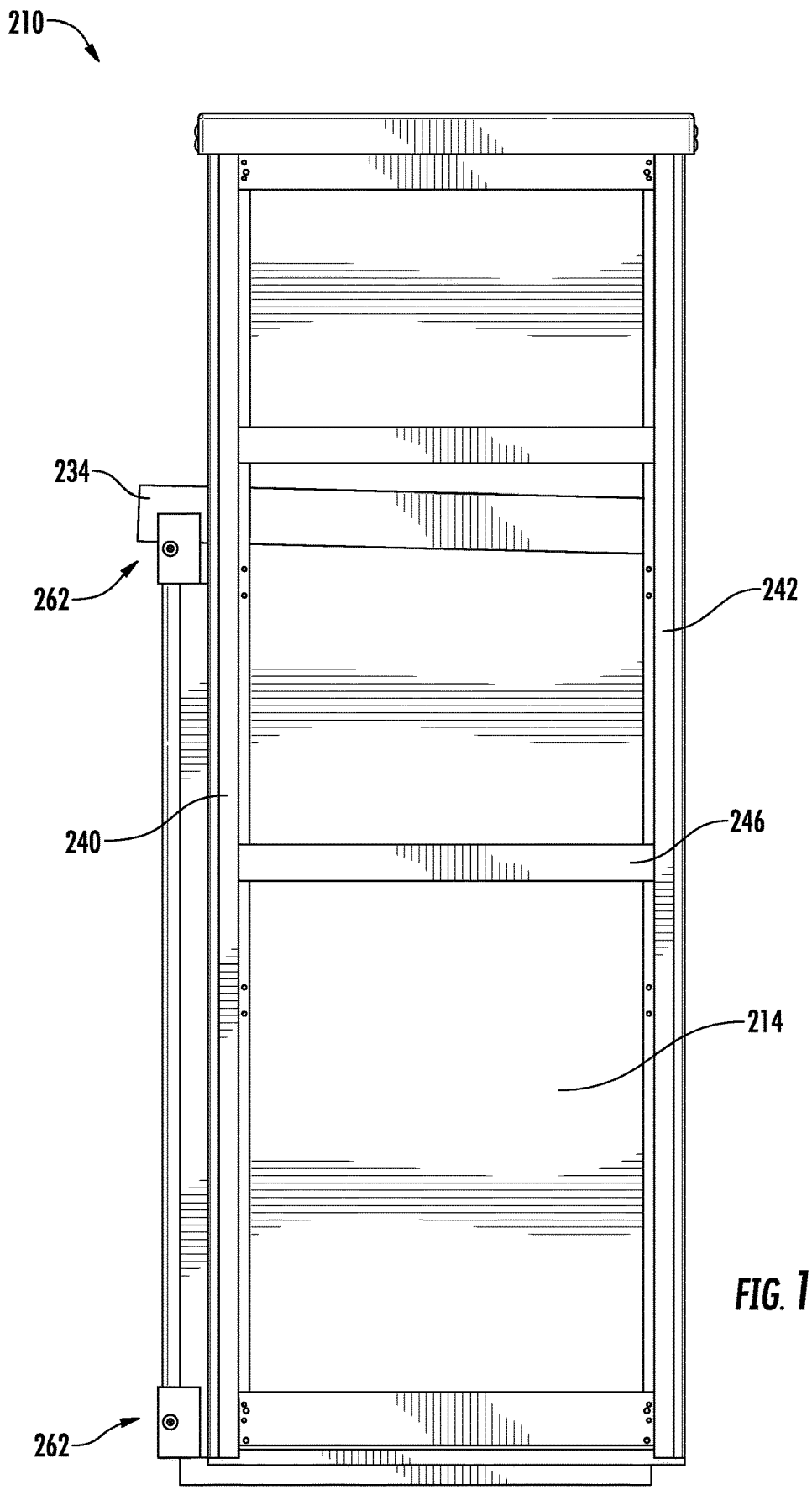
FIG. 13 is a side perspective view of the embodiment of FIG. 1 illustrating the locking assembly portion according to the teachings of the present invention.
Figure 14:
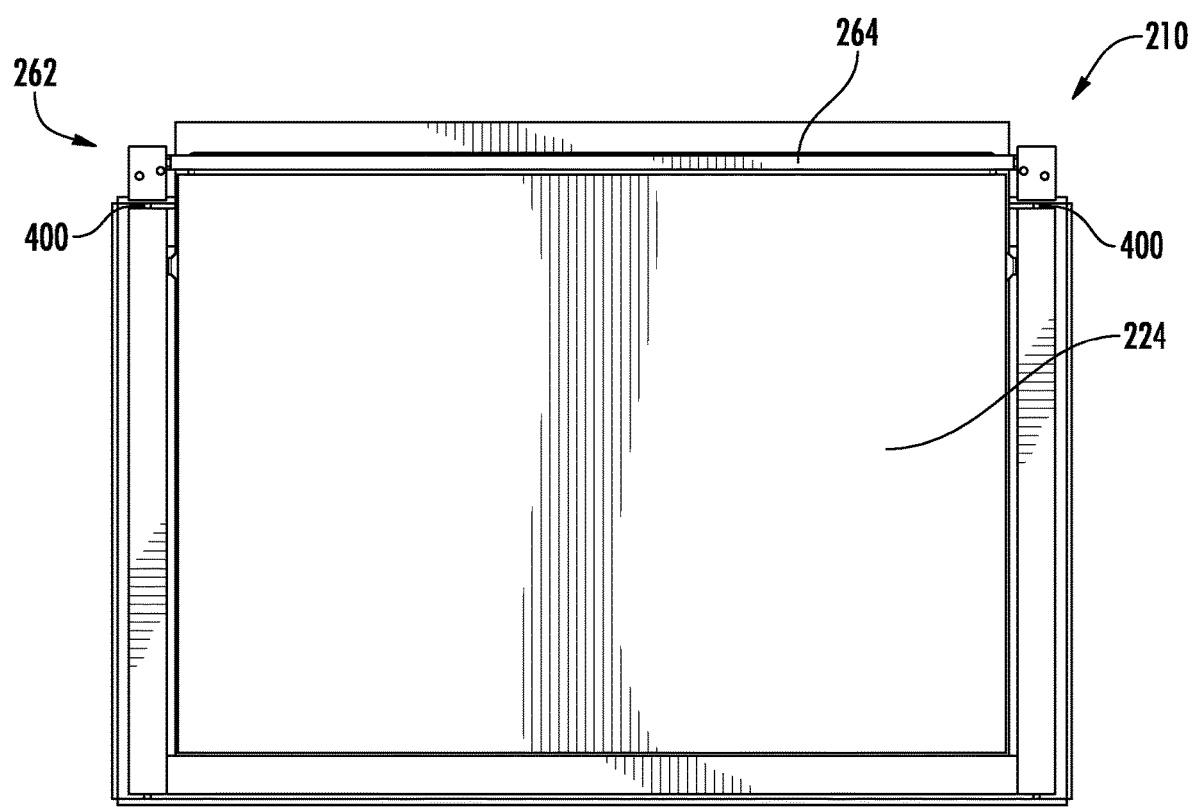
FIG. 14 is a bottom perspective view of the frame of the embodiment of FIG. 1 and use thereof.

As depicted in FIGS. 10-11, the locking assembly 262 may further comprise a second lock device configured in substantially the same manner as the first lock device. The second lock device includes a second housing 266 for receiving fourth 280, fifth 282, and sixth 284 locking pins, each locking pin having opposing first (a) and second (b) ends, the first end configured for receiving a key and the second end configured for receiving a connector. The fourth locking pin may be oriented substantially parallel to the fifth locking pin, and the sixth locking pin may be oriented substantially perpendicular to the fourth and fifth locking pins.

Embodiments of the locking assembly herein described may further comprise a tie rod 264 defining opposing first (c) and second (d) connectors, the first connector (c) configured for being removeably secured to the second end of the third locking pin, and the second connector configured for being removeably secured to the second end of the sixth locking pin. The first and second connectors may comprise a threaded member for being removeably secured to respective locking pins. Other connecting mechanisms, however, are considered to be within the scope of the present disclosure.

With continued reference to FIGS. 15-19, the lock device may further comprise at least one locking bar 290 configured for perpendicularly engaging at least one of the locking pins, thereby preventing the removal of the locking pin from the housing. The locking bar 290 may be held in place by a retaining pin 292 configured for engaging the housing and preventing disengagement of the at least one locking bar 290 from at least one of the locking pins.

By way of example, the advertising medium 210 may comprise first and second connectors 400, the first connector configured for removeably engaging the second end of a first locking pin, and the second connector configured for removeably engaging the second end of a second locking pin. Moreover, the cabinet may further comprises third and fourth connectors, the third connector configured for removeably engaging the second end of a fourth locking pin and the fourth connector configured for removeably engaging the second end of a fifth locking pin.

In one embodiment, the at least one locking assembly comprises a first lock device, a second lock device, and a tie rod extending therebetween, the tie rod defining opposing first and second connectors, the first lock device and the second lock device each comprising a housing configured for receiving first, second, and third locking pins, each locking pin having opposing first and second ends, the first end configured for receiving a key and the second end configured for receiving a connector, the second ends of the first and second locking pins removeably secured to the at least one connector extending from the bar, and the second end of the third locking pin removeably secured to at least one of the first and second connectors of the tie rod.

Exemplary embodiments may also include at least one locking bar configured for preventing removal of at least one of the first, second, and third locking pins from the housing. By way of example, the locking pins may have a notch formed at a portion thereof, wherein the at least one locking bar engages the notch. At least one retaining pin configured for engaging the housing and preventing movement of the at least one locking bar may also be provided.

With continued reference to FIGS. 10-19, another embodiment of the present disclosure includes a locking assembly for restricting access to a traffic control cabinet, the locking assembly comprising a lock device having a housing configured for receiving first, second, and third locking pins, each locking pin having opposing first and second ends, the first end configured for receiving a key and the second end configured for receiving a connector. The locking assembly may further comprise a second lock device having a housing configured for receiving first, second, and third locking pins, each locking pin having opposing first and second ends, the first end configured for receiving a key and the second end configured for receiving a connector.

In one embodiment, the locking assembly includes a tie rod defining opposing first and second connectors, the first connector removeably secured to at least one of the first, second, and third locking pins of the lock device, and the second connector removeably secured to at least one of the first, second, and third locking pins of the second lock device. A first locking bar configured for engaging at least one of the first, second, and third locking pins may be provided. Likewise, a second locking bar configured for engaging at least one of the first, second, and third locking pins may also be provided. In one configuration, the first locking bar engages the first and second pins, and the second locking bar engages the third pin. A retaining pin configured for engaging both the housing and at least one of the first and second locking bars may be provided for additional security.

It is to be understood that the invention is not to be limited to the specific embodiments disclosed, and that modifica- That which is claimed is:

1. An advertising medium comprising:
   a traffic control cabinet comprising a first side wall spaced from a second side wall, and front and rear walls extending therebetween, and top and bottom walls forming a rectangular-shaped housing having an enclosed storage area formed therein, the cabinet further comprising at least one door extending over an opening, the top wall extending beyond at least one of the first side wall, the second side wall, the front wall and the rear wall so as to form a flange thereover;
   a frame enclosing the cabinet, the frame defined by a plurality of siderails generally conforming to a periphery of the housing, at least one of the siderails having at least one connector extending therefrom;
   an advertising panel carried within at least one of the plurality of siderails;
   at least one locking assembly for restricting access to the enclosed storage area via the at least one door, the at least one locking assembly comprising a first lock device, a second lock device, and a tie rod extending therebetween, the tie rod defining opposing first and second connectors, the first lock device and the second lock device each comprising a housing configured for receiving first, second, and third locking pins, each locking pin having opposing first and second ends, the first end configured for receiving a key and the second end configured for receiving a connector, the second ends of the first and second locking pins removably secured to the at least one connector, and the second end of the third locking pin removably secured to at least one of the first and second connectors of the tie rod.

2. The traffic control cabinet as described in claim 1, further comprising at least one locking bar configured for preventing removal of at least one of the first, second, and third locking pins from the housing.

3. The traffic control cabinet as described in claim 2, further comprising at least one retaining pin configured for engaging the housing and preventing movement of the at least one locking bar.

4. A locking assembly for restricting access to a traffic control cabinet, the locking assembly comprising:
   a first lock device having a housing configured for receiving first, second, and third locking pins, each locking pin having opposing first and second ends, the first end configured for receiving a key and the second end configured for receiving a connector;
   a second lock device having a housing configured for receiving first, second, and third locking pins, each locking pin having opposing first and second ends, the first end configured for receiving a key and the second end configured for receiving a connector; and
   a tie rod defining opposing first and second connectors, the first connector removably secured to at least one of the first, second, and third locking pins of the first lock device, and the second connector removably secured to at least one of the first, second, and third locking pins of the second lock device.

5. The locking assembly as described in claim 4, further comprising a first locking bar configured for engaging at least one of the first, second, and third locking pins.

6. The locking assembly as described in claim 5, further comprising a second locking bar configured for engaging at least one of the first, second, and third locking pins.

7. The locking assembly as described in claim 6, wherein the first locking bar engages the first and second pins, and wherein the second locking bar engages the third pin.

8. The locking assembly as described in claim 7, further comprising a retaining pin configured for engaging both the housing and at least one of the first and second locking bars.

9. A locking assembly comprising:
   a first housing configured for receiving first, second, and third locking pins, each locking pin having opposing first and second ends, the first end configured for receiving a key and the second end configured for receiving a connector, wherein the first locking pin is oriented substantially parallel to the second locking pin, and wherein the third locking pin is oriented substantially perpendicular to the first and second locking pins;
   a second housing configured for receiving fourth, fifth, and sixth locking pins, each locking pin having opposing first and second ends, the first end configured for receiving a key and the second end configured for receiving a connector, wherein the fourth locking pin is oriented substantially parallel to the fifth locking pin, and wherein the sixth locking pin is oriented substantially perpendicular to the fourth and fifth locking pins; and
   a tie rod defining opposing first and second connectors, the first connector configured for being removably secured to the second end of the third locking pin, and the second connector configured for being removably secured to the second end of the sixth locking pin.

10. The locking assembly as described in claim 9, wherein the first and second connectors comprise first and second threaded members.

11. The locking assembly as described in claim 10, further comprising at least one locking bar configured for perpendicularly engaging at least one of the first, second, third, fourth, fifth, and sixth locking pins and preventing the removal thereof from the housing.

12. The locking assembly as described in claim 11, further comprising at least one retaining pin configured for engaging the housing and preventing disengagement of the at least one locking bar from at least one of the first, second, third, fourth, fifth, and sixth locking pins.

13. The locking assembly as described in claim 9, further comprising a cabinet defining an enclosed space therein, the cabinet having first and second connectors, the first connector configured for removably engaging the second end of the first locking pin, and the second connector configured for removably engaging the second end of the second locking pin.

14. The locking assembly as described in claim 13, wherein the cabinet further comprises third and fourth connectors, the third connector configured for removably engaging the second end of the fourth locking pin and the fourth connector configured for removably engaging the second end of the fifth locking pin.

15. The locking assembly as described in claim 14, wherein the cabinet comprises a traffic control cabinet.

* * * * *